United States Patent
Zhu et al.

(10) Patent No.: US 12,316,106 B2
(45) Date of Patent: May 27, 2025

(54) ELECTROSTATIC PROTECTION CIRCUIT FOR CONTROLLING A SECONDARY MONITORING UNIT BY A CONTROL CIRCUIT

(71) Applicant: CHANGXIN MEMORY TECHNOLOGIES, INC., Hefei (CN)

(72) Inventors: Ling Zhu, Hefei (CN); Kai Tian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 417 days.

(21) Appl. No.: 17/810,599

(22) Filed: Jul. 2, 2022

(65) Prior Publication Data

US 2023/0136979 A1 May 4, 2023

Related U.S. Application Data

(63) Continuation of application No. PCT/CN2021/138502, filed on Dec. 15, 2021.

(30) Foreign Application Priority Data

Nov. 4, 2021 (CN) .......................... 202111300465.5

(51) Int. Cl.
*H02H 9/04* (2006.01)
*H03K 17/30* (2006.01)

(52) U.S. Cl.
CPC .......... *H02H 9/046* (2013.01); *H03K 17/302* (2013.01)

(58) Field of Classification Search
CPC ........................... H01L 27/0285; H02H 9/046
See application file for complete search history.

(56) References Cited

U.S. PATENT DOCUMENTS

| | | | |
|---|---|---|---|
| 9,425,185 B2 | 8/2016 | Gauthier, Jr. | |
| 10,224,710 B2 | 3/2019 | Fifield | |
| 2006/0028777 A1 | 2/2006 | Chung | |
| 2006/0091464 A1* | 5/2006 | Hiraoka | H01L 27/0262 257/355 |
| 2007/0279816 A1 | 12/2007 | Chung | |
| 2015/0333508 A1 | 11/2015 | Ko | |
| 2016/0056625 A1 | 2/2016 | Tsaur et al. | |
| 2017/0155243 A1 | 6/2017 | Tan et al. | |
| 2019/0341772 A1* | 11/2019 | Hsu | G01R 31/002 |

FOREIGN PATENT DOCUMENTS

| | | |
|---|---|---|
| CN | 1734761 A | 2/2006 |
| CN | 103001205 A | 3/2013 |
| CN | 105097786 A | 11/2015 |
| CN | 109524949 A | 3/2019 |
| CN | 112103932 A | 12/2020 |

* cited by examiner

*Primary Examiner* — Gustavo A Rosario-Benitez
*Assistant Examiner* — Lakaisha Jackson
(74) *Attorney, Agent, or Firm* — Syncoda LLC; Feng Ma

(57) ABSTRACT

An electrostatic protection circuit for a chip including a power supply pad and a ground pad, the electrostatic protection circuit includes: a monitoring assembly, configured to generate a trigger signal when an electrostatic pulse is present on the power supply pad; a discharge transistor connected between the power pad and the ground pad and configured to be turned on under control of the trigger signal to discharge electrostatic charges to the ground pad; and a control circuit connected to the monitoring assembly and configured to control a duration of the trigger signal generated by the monitoring assembly.

13 Claims, 5 Drawing Sheets

ELECTROSTATIC PROTECTION CIRCUIT FOR CONTROLLING A SECONDARY MONITORING UNIT BY A CONTROL CIRCUIT

CROSS-REFERENCE TO RELATED APPLICATIONS

This application is a continuation of International Application No. PCT/CN2021/138502 filed on Dec. 15, 2021, which claims priority to Chinese Patent Application No. 202111300465.5 filed on Nov. 4, 2021. The disclosures of these applications are hereby incorporated by reference in their entirety.

BACKGROUND

Electro-Static discharge (ESD) is one of the unavoidable phenomena for a device such as a chip containing a large-scale integrated circuit. In order to reduce the effect of ESD on the device, it is necessary to design an effective electrostatic protection circuit in the manufacturing process of the chip. However, with the development of the large-scale integrated circuit, the requirements for high integration are constantly increasing, and devices become increasingly sophisticated, which poses a great challenge to the design of the electrostatic protection circuit.

SUMMARY

Embodiments of the present disclosure relate to semiconductor manufacturing technologies, and relate to, but are not limited to, an electrostatic protection circuit for a chip.

In view of the above, embodiments of the present disclosure provide an electrostatic protection circuit for a chip including a power supply pad and a ground pad, where the electrostatic protection circuit includes: a monitoring assembly, configured to generate a trigger signal when an electrostatic pulse is present on the power pad; a discharge transistor, connected between the power pad and the ground pad and configured to be turned on under control of the trigger signal to discharge electrostatic charges to the ground pad; and a control circuit, connected to the monitoring assembly and configured to control a duration of the trigger signal generated by the monitoring assembly.

BRIEF DESCRIPTION OF THE DRAWINGS

The accompanying drawings herein are incorporated in and constitute a part of this specification, illustrate embodiments conforming to the present disclosure and, together with the description, serve to explain the principles of the disclosure.

Specific embodiments of the present disclosure have been shown by the above drawings, and will be described in more detail hereinafter. These drawings and textual descriptions are not intended to limit the scope of the inventions of the present disclosure in any way, but rather to illustrate the concepts of the present disclosure by reference to specific embodiments by those skilled in the art.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the invention as recited in the appended claims.

Other embodiments of the present disclosure will be readily contemplated by those skilled in the art after considering the specification and practicing the invention disclosed herein. The present application is intended to cover any variations, uses, or adaptations of the present disclosure that follow the general principles of the present disclosure and include well-known common sense or customary technical means in the art that are not disclosed in the present disclosure. The specification and embodiments are considered exemplary only, and the true scope and spirit of the present disclosure are indicated by the following claims. The technical solution of the present disclosure is further described in detail below in conjunction with the accompanying drawings and embodiments.

Figure 1:
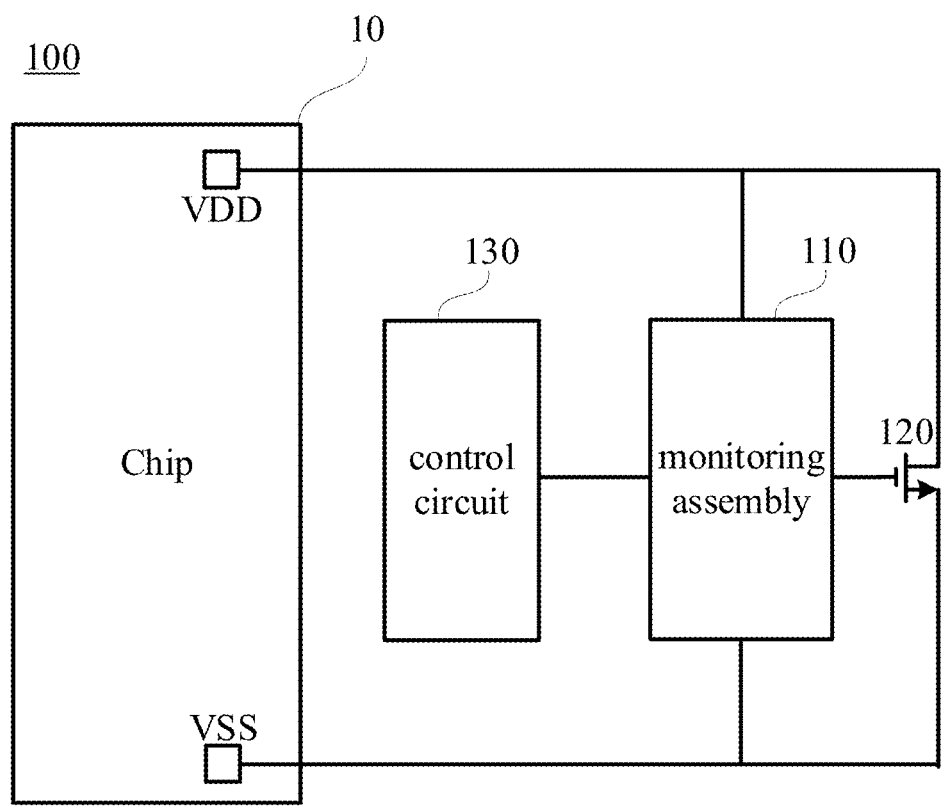
FIG. 1 is a first schematic structural diagram of an electrostatic protection circuit according to an embodiment of the present disclosure.

FIG. 1 shows an electrostatic protection circuit for a chip according to an embodiment of the present disclosure. As shown in FIG. 1, the chip includes: a power supply pad VDD and a ground pad VSS; and the electrostatic protection circuit 100 includes: a monitoring assembly 110 configured to generate a trigger signal when an electrostatic pulse is present on the power pad VDD; a discharge transistor 120 connected between the power pad VDD and the ground pad VSS, and configured to be turned on under control of the trigger signal to discharge electrostatic charges to the ground pad; and a control circuit 130 connected to the monitoring assembly 110, and configured to control a duration of the trigger signal generated by the monitoring assembly 110.

In the embodiment of the present disclosure, under the influence of electrostatic charges, the monitoring assembly 110 may trigger the discharge transistor 120 to discharge the electrostatic charges. That is to say, when an electrostatic pulse is present on the power supply pad VDD, the electrostatic pulse is transferred to the monitoring assembly 110 to generate a trigger signal. The trigger signal is generated only when the electrostatic pulse is present, so that the discharge transistor 120 is turned on to form a discharge path between the power supply pad VDD and the ground pad VSS. Therefore, it is possible to facilitate discharging the electrostatic pulses through the discharge path, so as to achieve the function of protecting the chip 10.

In the absence of an electrostatic pulse in the normal operation of the chip, the monitoring assembly 110 does not generate the trigger signal, and therefore does not trigger turning on of the discharge transistor 120.

Since the duration of the trigger signal generated by the monitoring assembly 110 affects the discharge duration of the discharge transistor 120, and further affects the electrostatic discharge effect, it is necessary to adjust the discharge duration by adjusting the duration of the trigger signal generated by the monitoring assembly 110, so as to determine the duration that satisfies the electrostatic protection requirement.

Exemplarily, the number or combination of elements operating in the monitoring assembly 110 may affect the duration. Therefore, in the embodiment of the present disclosure, the control circuit is configured to flexibly adjust the duration of the trigger signal generated by the monitoring assembly 110. For example, the duration is adjusted by adjusting the number of connected components, so as to achieve the purpose of testing the discharge effect of the electrostatic protection circuit, and further determine the electrostatic protection circuit meeting the requirement.

Figure 2:
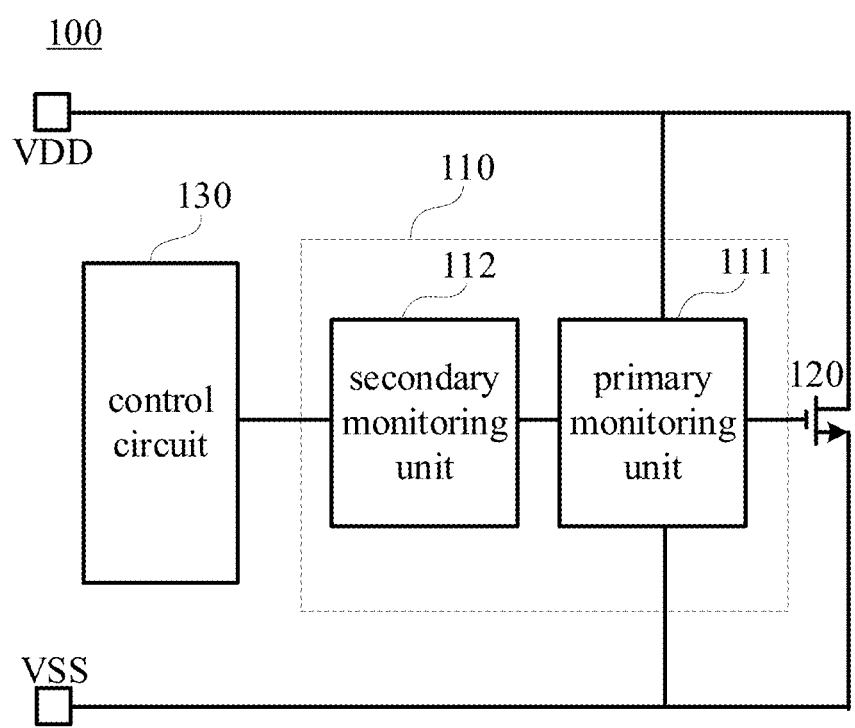
FIG. 2 is a second schematic structural diagram of an electrostatic protection circuit according to an embodiment of the present disclosure.
Figure 3:
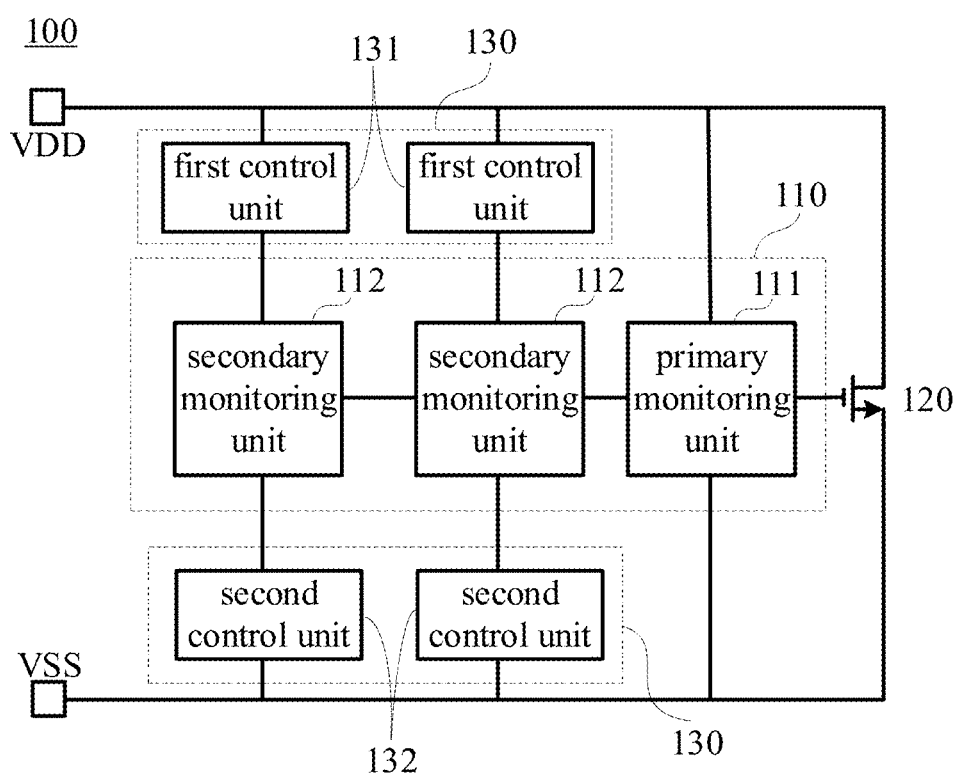
FIG. 3 is a third schematic structural diagram of an electrostatic protection circuit according to an embodiment of the present disclosure.

In some embodiments, as shown in FIG. 2, the monitoring assembly 110 includes a primary monitoring unit 111 and at least one secondary monitoring unit 112. The primary monitoring unit 111 is connected between the power supply pad VDD and the ground pad VSS; the primary monitoring unit 111 and the secondary monitoring unit are connected to a control terminal 121 of the discharge transistor 120, and output signals of the primary monitoring unit and the secondary monitoring unit are together applied to the control terminal of the discharge transistor; and the secondary monitoring unit 112 is connected to the control circuit 130.

In the embodiment of the present disclosure, the primary monitoring unit 111 of the monitoring assembly 100 is connected to the control terminal of the discharge transistor 120, so that the output signal of the primary monitoring unit 111 can be used as the trigger signal to trigger the turning on of the discharge transistor 120.

The secondary monitoring unit 112 is connected to the control circuit 130, and the secondary monitoring unit 112 is also connected to the control terminal. In this way, the signal output by the secondary monitoring unit and the trigger signal output by the primary monitoring unit 111 are together applied to the control terminal, so that the duration of the trigger signal can be controlled by adjusting the operation state of the secondary monitoring unit.

In the embodiment of the present disclosure, the secondary monitoring unit 112 is connected to the control circuit 130. The control circuit 130 may adjust the secondary monitoring unit 112 to output different signals, and the different signals and the trigger signal output from the primary monitoring unit 111 are together applied to the discharge transistor, so that the trigger signal has different durations. Exemplarily, multiple secondary monitoring units 112 may be connected to the primary monitoring unit 111, and the number of secondary monitoring units 112 may affect the duration of the trigger signal. Therefore, the number of secondary monitoring units 112 connected to the primary monitoring unit 111 can be changed by the control circuit 130, so that the effect of controlling the duration of the trigger signal output from the monitoring assembly 110 is achieved.

In some embodiments, the control circuit 130 includes: at least one first control unit 131 and at least one second control unit 132, a number of the at least one first control unit 131 being identical to a number of the at least one second control unit 132, and being identical to a number of the at least one secondary monitoring unit 112, where the first control unit is connected between the secondary monitoring unit 112 and the power supply pad VDD, and the first control unit is configured to control an operation state of the secondary monitoring unit by a power supply voltage supplied from the power supply pad; and the second control unit 132 is connected between the secondary monitoring unit 112 and the ground pad VSS, and the second control unit is configured to control the operation state of the secondary monitoring unit by a ground voltage supplied from the ground pad.

In the embodiment of the present disclosure, both the first control unit 131 and the second control unit 132 in the control circuit 130 are elements having switching characteristics, and may function to turn on or turn off a specified signal path. Exemplarily, the first control unit 131 and the second control unit 132 may be implemented by a three-terminal device such as an MOS transistor, a bipolar junction transistor, or the like.

The number of the first control unit 131 may be identical to the number of the second control unit 132 and the number of the secondary monitoring unit 112, that is to say, each secondary monitoring unit 112 may be respectively connected to one first control unit 131 and one second control unit 132. The first control unit 131 is connected between the secondary monitoring unit 112 and the power supply pad VDD. Therefore, when the first control unit 131 is turned on and the second control unit 132 is turned off, the voltage of the power supply pad VDD is applied to the secondary monitoring unit 112; and when the second control unit 132 is turned on and the first control unit 131 is turned off, the voltage of the ground pad VSS is applied to the secondary monitoring unit 112. By applying different voltages to the secondary monitoring unit, the functions of the secondary monitoring unit 112 in the monitoring assembly 110, such as voltage division, shunting, increasing current and increasing voltage, can be changed, and thus, the duration of the trigger signal generated by the monitoring assembly 110 can be adjusted.

In the embodiment of the present disclosure, since the monitoring assembly 110 includes multiple secondary monitoring units 112, the monitoring assembly 110 can output multiple trigger signals having different durations by combinations of the turning one and turning off of the first control unit 131 and the second control unit 132 corresponding to the multiple secondary monitoring units 112. In practical applications, it is possible to determine, through experiments, one of these trigger signals having different durations that can bring a better electrostatic protection effect, and the combination corresponding to a determined trigger signal can be taken as a structure in an actual product for mass production.

Figure 4:
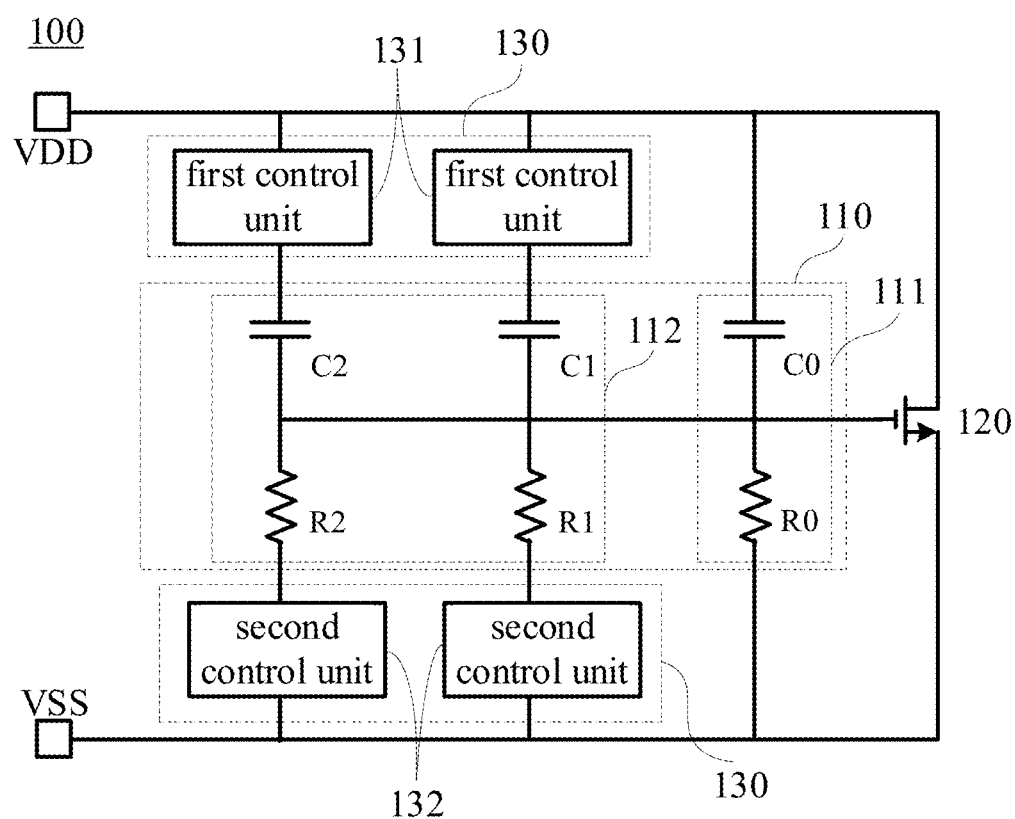
FIG. 4 is a fourth schematic structural diagram of an electrostatic protection circuit according to an embodiment of the present disclosure.

In some embodiments, as shown in FIG. 4, the secondary monitoring unit 112 includes a monitoring capacitor C1 having a first end connected to the first control unit 131; and a monitoring resistor R1 having a first end connected to a second end of the monitoring capacitor C1 and the control terminal 121 of the discharge transistor 120, and having a second end connected to the second control unit 132.

The secondary monitoring unit 112 is constituted by an resistor-capacitor (RC) circuit, and one end of the RC circuit, that is, the first end of the monitoring capacitor C1 is connected to the power supply pad VDD through the first control unit 131; and the other end of the RC circuit, that is, the second end of the monitoring resistor R1 is connected to the ground pad VSS through the second control unit 132. In addition, the connection terminal of the monitoring capacitor C1 and the monitoring resistor R1 in the RC circuit is also connected to the control terminal of the discharge transistor 120. That is to say, both the secondary monitoring unit 112 and the primary monitoring unit 111 may be connected to the discharge transistor 120, to work together to output the trigger signal. Since the electrostatic protection circuit may include multiple secondary monitoring units, two secondary monitoring units are shown in FIG. 4, where the monitoring resistors of the secondary monitoring units are denoted by R1 and R2, respectively, and the monitoring capacitors of the secondary monitoring units are denoted by C1 and C2, respectively.

The multiple secondary monitoring units 112 are all connected to the control terminal of the discharge transistor 120, and the number of connected monitoring resistors and monitoring capacitors can be changed by switching the on states of the first control unit 131 and the second control unit 132. The smaller the total resistance R in the monitoring assembly, the shorter the duration of the trigger signal; and the larger the total capacitance C, the longer the corresponding duration of the trigger signal.

In some embodiments, as shown in FIG. 4, the primary monitoring unit 111 includes a primary monitoring capacitor C0 having a first end connected to the power supply pad VDD; and a primary monitoring resistor R0 having a first end connected to the primary monitoring capacitor C0 and the control terminal of the discharge transistor 120, and having a second end connected to the ground pad VSS.

Since at least one monitoring unit is required in the monitoring assembly 110, the primary monitoring unit 111 may be directly connected between the power supply pad VDD and the ground pad VSS without requiring the control units to switch their on state.

It can be seen that when both the first control unit 131 and the second control unit 132 connected to the secondary monitoring unit 112 are in the on state, the structure of the secondary monitoring unit 112 is substantially identical to the structure of the primary monitoring unit 111, and the secondary monitoring unit 112 and the primary monitoring unit 111 are connected in parallel between the power supply pad VDD and the ground pad VSS. Each of the RC circuits is connected to the control terminal of the discharge transistor 120, which means that all the capacitors respectively in the secondary monitoring unit 112 and the primary monitoring unit 111 are connected in parallel with each other, and all the resistors respectively in the secondary monitoring unit 112 and the primary monitoring unit 111 are connected in parallel with each other. Therefore, the more the secondary monitoring units 112 that are turned on in the monitoring assembly, the more the parallel capacitors and resistors, the larger the total capacitance C, and the smaller the total resistance R. Certainly, the capacitance values of the capacitors in respective monitoring units 112 may be different from each other, and the resistance values of the resistors in respective secondary monitoring units 112 may be different from each other, so that various combinations of capacitance values and resistance values can be implemented, and thus flexible and precise adjustment can be realized.

In some embodiments, the control circuit 130 further includes a first switch assembly configured to switch an operation state of the first control unit 131; and a second switch assembly configured to switch an operation state of the second control unit 132.

Figure 5:
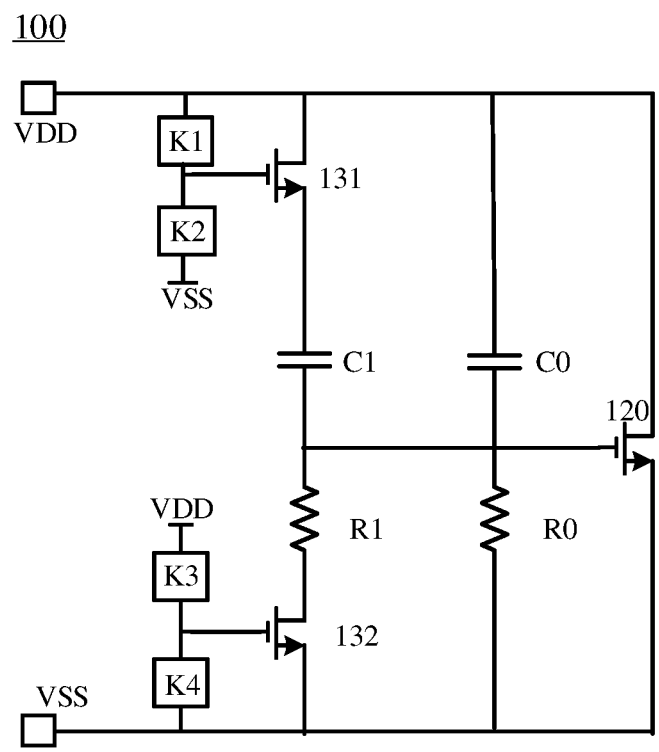
FIG. 5 is a fifth schematic structural diagram of an electrostatic protection circuit according to an embodiment of the present disclosure.

In some embodiments, as shown in FIG. 5, the first switch assembly includes a first switch K1 and a second switch K2, the control terminal of the first control unit 131 being connected to the power supply pad VDD through the first switch K1 and being connected to the ground pad VSS through the second switch K; and the second switch assembly includes a third switch K3 and a fourth switch K4, the control terminal of the second control unit 132 being connected to the power supply pad VDD through the third switch K3 and being connected to the ground pad VSS through the fourth switch K4.

In the embodiment of the present disclosure, the on states of the first control unit 131 and the second control unit 132 may be switched by two switches. Each of the first switch K1 to the fourth switch K4 has a first end and a second end.

The first end of the first switch K1 is connected to the control terminal of the first control unit 131, and the second end of the first switch K11 is connected to a power supply, which may be configured to provide the power supply voltage VDD equal to a potential of the power supply pad. The first switch K1 is configured to switch from a closed state to an open state or from the open state to the closed state under the control of the control signal, so as to determine whether the power supply voltage VDD is supplied to the control terminal of the first control unit 131.

The first end of the second switch K2 is connected to the control terminal of the first control unit 131, and the second end of the second switch K2 is grounded or a low potential, that is, a low voltage VSS having an equal potential to the ground pad. The second switch K2 is configured to switch from the closed state to the open state or from the open state to the closed state under the control of the control signal, so as to determine whether the ground voltage VSS is supplied to the control terminal of the first control unit 131.

The first switch K1 and the second switch K2 have the characteristic that they cannot be turned on or turned off at the same time, but the first switch K1 may be turned on and the second switch K2 may be turned off, so that the potential of the control terminal of the first control unit 131 reaches the power supply voltage VDD, or the second switch K2 may be turned on and the first switch K1 may be turned off, so that the potential of the control terminal of the first control unit 131 reaches the low voltage VSS. In this way, switching of the on state of the first control unit 131 can be implemented.

Similarly to the first control unit 131, the control terminal of the second control unit 132 is also connected to two switches, i.e., the third switch K3 and the fourth switch K4, respectively. The switching of the on state of the second control unit 132 can be implemented by the switching states of the third switch K3 and the fourth switch K4.

In some embodiments, the first control unit 131 is configured to switch, according to switching states of the first switch K1 and the second switch K2, from a cutoff state to an on state to increase a total capacitance of the monitoring assembly 110, or from the on state to the off state to reduce the total capacitance of the monitoring assembly 110, where the switching state of the first switch is different from the switching state of the second switch.

The total capacitance of the monitoring assembly 110 can be determined by whether each first control unit 131 is turned on, and the total resistance of the monitoring assembly 110 can be determined by whether each second control unit 132 is turned on. Therefore, it is possible to adjust the total capacitance or total resistance as a whole with the monitoring assembly 110 by changing the switching states of the switches as described above, rather than merely changing the number of secondary monitoring units.

Herein, the total capacitance of the monitoring assembly 110 is adjusted by switching the states of the first switch K1 and the second switch K2 in each secondary monitoring unit.

In some embodiments, the states of the first switch K1 and the second switch K2 may include the on state or the off state, when the switch is in the on state, the circuit where the switch is located is turned on, and the potentials at two ends of the switch are the same; when the switch is in the off state, the circuit where the switch is located is turned off, and the potentials at two ends of the switch are different.

Specifically, in some embodiments, the first control unit 131 is an N-type transistor; when the first switch K1 is in the on state and the second switch K2 is in the off state, the first control unit 131 is in the on state; and when the first switch K1 is in the off state and the second switch K2 is in the on state, the first control unit 131 is in the cutoff state.

In some embodiments, the first control unit 131 is a P-type transistor. when the first switch K1 is in the on state and the second switch K2 is in the off state, the first control unit 131 is in the cutoff state; and when the first switch K1 is in the off state and the second switch K2 is in the on state, the first control unit 131 is in the on state.

Similarly to the first control unit 131, the state of the second control unit 132 is controlled by the third switch K3 and the fourth switch K4. Specifically, in some embodiments, the second control unit 132 is configured to switch, according to the switching states of the third switch K3 and the fourth switch K4, from an cutoff state to an on state to reduce a total resistance of the monitoring assembly 110, or from the on state to the cutoff state to increase the total resistance of the monitoring assembly 110.

That is to say, by individually controlling the switching states of the third switch K3 and the fourth switch K4 in each secondary monitoring unit, the total resistance of the monitoring assembly 110 can be adjusted.

Herein, the states of the third switch K3 and the fourth switch K4 include an on state or an off state. When the switch is in the on state, the circuit where the switch is located is turned on, and the potentials at both ends of the switch are the same; when the switch is in the off state, the circuit where the switch is located is turned off, and the potential at both ends of the switch are different.

Specifically, in some embodiments, the second control unit 132 is an N-type transistor. When the third switch K3 is in the on state and the fourth switch K4 is in the off state, the second control unit 132 is in the on state; and when the third switch K3 is in the off state and the fourth switch K4 is in the on state, the second control unit 132 is in the cutoff state.

In some embodiments, the second control unit 132 is a P-type transistor. When the third switch K3 is in the on state and the fourth switch K4 is in the off state, the second control unit 132 is in the cutoff state; and when the third switch K3 is in the off state and the fourth switch K4 is in the on state, the second control unit 132 is in the on state.

In some embodiments, the first switch, the second switch, the third switch and the fourth switch are one-time-programmable (OTP) memories.

By programming control of the OTP memories, switching of the switching states of the first switch K1 to the fourth switch K4 can be implemented, and thus the control of the first control unit 131 and the second control unit 132 is implemented.

Since electrostatic breakdown typically occurs in a power-off state, the solution of controlling the switch to close or open through a control signal generated by a circuit cannot be applied to the case where the chip is in the power-off state. The adjustment of the electrostatic protection capability of the electrostatic protection circuit by switching the operating states of the first control unit 131 and the second control unit 132 through the programming control of the disposable programmable device can be implemented without requiring that the chip is in a power-on state, so that the chip having the electrostatic protection circuit with different structures can be obtained according to the test requirements, and then the chip is tested for the electrostatic protection capability.

In some embodiments, the first switch, the second switch, the third switch and the fourth switch are laser fuse devices.

The laser fuse device is an OTP device. The laser fuse device connected to the first control unit 131 and the second control unit 132 is irradiated with laser light, so that the first control unit 131 and the second control unit 132 can be switched between the on state and the off state. In this way, the electrostatic protection capability of the chip can be set according to the test requirements.

It should be understood that reference throughout the specification to "one embodiment" or "an embodiment" means that a particular feature, structure, or characteristic associated with the embodiment is included in at least one embodiment of the present disclosure. Thus, the appearances of & "in one embodiment" or "in an embodiment" in various places throughout the specification do not necessarily refer to the same embodiment. Furthermore, these specific features, structures, or characteristics may be combined in any suitable manner in one or more embodiments. It is to be understood that, in the various embodiments of the present disclosure, the magnitude of the sequence numbers of the processes described above is not meant to mean the order of execution, and the order of execution of the processes should be determined by their function and intrinsic logic, and should not be construed as any limitation on the implementation of the embodiments of the present disclosure. The numbers of the embodiments of the present disclosure are for description only and do not represent that one embodiment is superior to another embodiment.

It is to be noted that, in this disclosure, the terms "includes", "including" or any other variation thereof, are intended to cover a non-exclusive inclusion, such that a process, method, article, or device that includes a list of elements includes not only those elements but also other elements not expressly listed, or also includes elements inherent to such process, method, article, or device. Without more limitations, an element is defined by the statement "including a . . . " that does not rule out there are additional identical elements in a process, method, article, or apparatus that includes the element.

In several embodiments provided by the present disclosure, it should be understood that the disclosed devices and methods can be realized in other ways. For example, the embodiment of the device described above is only schematic. For example, the division of the unit is only a logical function division, and there can be another division method in actual implementation, for example, multiple units or components can be combined or integrated into another system, or some features can be ignored or not implemented. On the other hand, the mutual coupling or direct coupling or communication connection illustrated or discussed can be indirect coupling or communication connection through some interfaces, devices or units, and can be electric, mechanical or other forms.

The unit described as a separation part may or may not be physically separated, and the unit displayed as a unit may or may not be a physical unit, that is, it may be located in one place, or it may be distributed to multiple network units. Some or all of the units can be selected according to the actual needs to achieve the purpose of the embodiment.

In addition, each functional unit in each embodiment of the present disclosure may be integrated in one processing unit, each unit may exist physically alone, or two or more units may be integrated in one unit; the integrated unit may be implemented in the form of hardware or in the form of the combination of the hardware and software functional units.

The above is only the specific embodiments of the disclosure, but the scope of protection of the disclosure is not limited to this. Any person skilled in the technical field who can easily think of change or replacement within the technical scope of the disclosure shall be covered in the scope of protection of the disclosure. Therefore, the protection scope of the disclosure shall be subject to the protection scope of the claims.

The electrostatic protection circuit provided by the technical solutions of the embodiments of the present disclosure has a discharge transistor and a monitoring assembly, and also has a control circuit configured to control a duration of the trigger signal generated by the monitoring assembly. In this way, the adjustment and test can be performed by the control circuit to determine an electrostatic protection circuit meeting requirements on the electrostatic protection capability, without the need for multiple tape-outs, it is thus possible to reduce the cost of designing and testing the electrostatic protection circuit, and optimize the protection capability of the electrostatic protection circuit.

What is claimed is:

1. An electrostatic protection circuit for a chip comprising a power supply pad and a ground pad, the electrostatic protection circuit comprising:
   a monitoring assembly, configured to generate a trigger signal when an electrostatic pulse is present on the power supply pad;
   a discharge transistor connected between the power pad and the ground pad, and configured to be turned on under control of the trigger signal to discharge electrostatic charges to the ground pad; and
   a control circuit connected to the monitoring assembly, and configured to control a duration of the trigger signal generated by the monitoring assembly;
   wherein the monitoring assembly comprises:
   a primary monitoring unit and at least one secondary monitoring unit,
   wherein
   the primary monitoring unit is connected between the power supply pad and the ground pad;
   the primary monitoring unit and the secondary monitoring unit are both connected to a control terminal of the discharge transistor, and output signals of the primary monitoring unit and the secondary monitoring unit are together applied to the control terminal; and
   the secondary monitoring unit is connected to the control circuit;
   wherein the control circuit comprises at least one first control unit and at least one second control unit, a number of the at least one first control unit being identical to a number of the at least one second control unit, and being identical to a number of the at least one secondary monitoring unit,
   wherein the first control unit is connected between the secondary monitoring unit and the power supply pad, and the first control unit is configured to control an operation state of the secondary monitoring unit by a power supply voltage supplied from the power supply pad; and
   the second control unit is connected between the secondary monitoring unit and the ground pad, and the second control unit is configured to control the operation state of the secondary monitoring unit by a ground voltage supplied from the ground pad.

2. The electrostatic protection circuit of claim 1, wherein the secondary monitoring unit comprises:
   a monitoring capacitor having a first end connected to the first control unit; and
   a monitoring resistor having a first end connected to a second end of the monitoring capacitor and the control terminal of the discharge transistor, and having a second end connected to the second control unit.

3. The electrostatic protection circuit of claim 2, wherein the control circuit further comprises:
   a first switch assembly configured to switch an operation state of the first control unit; and
   a second switch assembly configured to switch an operation state of the second control unit.

4. The electrostatic protection circuit of claim 3, wherein the first switch assembly comprises a first switch and a second switch, a control terminal of the first control unit being connected to the power supply pad through the first switch and being connected to the ground pad through the second switch; and
   the second switch assembly comprises a third switch and a fourth switch, a control terminal of the second control unit being connected to the power supply pad through the third switch and being connected to the ground pad through the fourth switch.

5. The electrostatic protection circuit of claim 4, wherein the first control unit is configured to switch, according to switching states of the first switch and the second switch, from a cutoff state to an on state to increase a total capacitance of the monitoring assembly, or from the on state to the off state to reduce the total capacitance of the monitoring assembly, wherein the switching state of the first switch is different from the switching state of the second switch.

6. The electrostatic protection circuit of claim 5, wherein the first control unit is an N-type transistor;
   when the first switch is in the on state and the second switch is in the off state, the first control unit is in the on state; and
   when the first switch is in the off state and the second switch is in the on state, the first control unit is in the cutoff state.

7. The electrostatic protection circuit of claim 5, wherein the first control unit is a P-type transistor;
   when the first switch is in the on state and the second switch is in the off state, the first control unit is in the cutoff state; and
   when the first switch is in the off state and the second switch is in the on state, the first control unit is in the on state.

8. The electrostatic protection circuit of claim 4, wherein the second control unit is configured to switch, according to the switching states of the third switch and the fourth switch, from an cutoff state to an on state to reduce a total resistance of the monitoring assembly, or from the on state to the cutoff state to increase the total resistance of the monitoring assembly, wherein the switching state of the third switch is different from the switching state of the fourth switch.

9. The electrostatic protection circuit of claim 8, wherein the second control unit is the N-type transistor;
   when the third switch is in the on state and the fourth switch is in the off state, the second control unit is in the on state; and when the third switch is in the off state and the fourth switch is in the on state, the second control unit is in the cutoff state.

10. The electrostatic protection circuit of claim 8, wherein the second control unit is a P-type transistor;

when the third switch is in the on state and the fourth switch is in the off state, the second control unit is in the cutoff state; and when the third switch is in the off state and the fourth switch is in the on state, the second control unit is in the on state.

11. The electrostatic protection circuit of claim 3, wherein the first switch, the second switch, the third switch and the fourth switch are one-time-programmable (OTP) memories.

12. The electrostatic protection circuit of claim 11, wherein the first switch, the second switch, the third switch and the fourth switch are laser fuse devices.

13. The electrostatic protection circuit of claim 1, wherein the primary monitoring unit comprises:

a primary monitoring capacitor having a first end connected to the power supply pad; and a primary monitoring resistor having a first end connected to the primary monitoring capacitor and the control terminal of the discharge transistor, and a second end connected to the ground pad.

* * * * *